United States Patent [19]
Tam et al.

[11] 4,404,581
[45] Sep. 13, 1983

[54] ROM WITH REDUNDANT ROM CELLS EMPLOYING A HIGHLY RESISTIVE POLYSILICON FILM FOR PROGRAMMING THE CELLS

[75] Inventors: Matthias L. Tam, Monterey Park; Frank Z. Custode, Norco, both of Calif.

[73] Assignee: Rockwell International Corporation, El Segundo, Calif.

[21] Appl. No.: 216,578

[22] Filed: Dec. 15, 1980

[51] Int. Cl.³ .................. H01L 29/04; H01L 29/12; H01L 29/78; H01L 27/02
[52] U.S. Cl. ......................... 357/59; 357/23; 357/41; 357/51; 357/58
[58] Field of Search ............. 357/23 C, 23 TF, 23 R, 357/23 VT, 23 D, 23 MG, 51, 59, 58, 41; 307/304; 365/104

[56] References Cited
U.S. PATENT DOCUMENTS 4,231,051 10/1980 Ceistode et al. .................. 357/41 X
4,297,721 10/1981 McKenny et al. ................ 357/59 X

FOREIGN PATENT DOCUMENTS

54/128295 10/1979 Japan ..................................... 357/51

OTHER PUBLICATIONS

T. H. Ning, "Polysilicon Resistor Process for Bipolar and MOS applications", *IBM Technical Disclosure Bulletin*, vol. 23, (1980) pp. 368–370.

Primary Examiner—James W. Davie
Assistant Examiner—J. Carroll
Attorney, Agent, or Firm—H. Fredrick Hamann; Wilfred G. Caldwell

[57] ABSTRACT

The present invention comprises a unique FET with resistor in its drain lead of undoped polysilicon which may be characterized by high resistance in the absence of the application of a biasing voltage across the FET and the resistor when the FET is conducting, which biasing voltage irreversibly changes the resistor to a high state of conductivity thereby selectively providing the two logic states. This device may comprise a redundant cell for a ROM memory and may be uniquely fabricated utilizing VLSI MOS processing steps to provide a new manufacturing process.

5 Claims, 21 Drawing Figures

ROM WITH REDUNDANT ROM CELLS EMPLOYING A HIGHLY RESISTIVE POLYSILICON FILM FOR PROGRAMMING THE CELLS

FIELD OF THE INVENTION

The subject invention relates to a new redundant cell for ROM use and method of manufacture compatible to manufacture of the ROM through VLSI processing.

BACKGROUND OF THE INVENTION

While the subject invention provides a new product and process, a related process is set forth in U.S. Pat. No. 4,231,051 issued to the same inventors on Oct. 28, 1980. This is the closest known prior art and while it teaches employing a first and second layer of polysilicon in processing, it does not teach the provision of a redundant ROM cell comprising a FET and drain connected series resistor nor a process for fabricating the same, wherein the resistor is manufactured from the second undoped polysilicon layer and the cell is programmable by irreversibly changing the resistor from a high resistance value to a highly conductive value through the application of a biasing voltage when the associated FET is conductive.

SUMMARY OF THE INVENTION

The invention comprises a redundant cell for a high density ROM including a substrate, a gate with contact, a source with contact, a drain and resistor region comprising a polysilicon layer adjacent a drain doped region of the substrate, and undoped polysilicon layer comprising a resistor over the drain polysilicon layer and a contact over the undoped polysilicon layer for the drain and resistor. The resistor undoped polysilicon layer is characterized by high resistance until a biasing voltage is applied across the transistor and resistor combination with the transistor conducting which irreversibly changes the characterization of the resistor to high conductivity thereby providing a two-state device useful for logic programming. The invention further comprises a unique process for fabricating the redundant ROM cell.

BRIEF DESCRIPTION OF THE DRAWINGS

FIG. 1 is a cross-sectional view through a semiconductor wafer having a thermal oxide layer on its surface.

FIG. 2 is a plan view illustrating a portion of a polycrystalline silicon to monocrystalline silicon contact mask.

FIG. 3 is a cross-sectional view taken along line 3—3 in FIG. 2, illustrating the wafer cross-sectional structure following the removal of the unprotected oxide in accordance with the masking pattern of the mask of FIG. 2.

FIG. 4 is a cross-sectional view as in FIG. 3, illustrating the water cross-sectional structural, after the deposition of a polysilicon layer and the successive deposition of a silicon nitride layer.

FIG. 5 is a plan view illustrating an isolation mask utilized for defining areas where an isolating field ixode will be formed.

FIG. 6 is a cross-sectional view through the wafer taken along line 6—6 in FIG. 5, after removal of various layers from the areas which are not protected by the photoresist exposed through the isolation mask of FIG. 5.

FIG. 7 is a cross-sectional view as in FIG. 6, illustrating the wafer following the growth of the field oxide.

FIG. 8 is a plan view illustrating a gate contact mask.

FIG. 9 is a cross-sectional view taken along line 9—9 in FIG. 8, showing the wafer cross-sectional structure following the definition of the photoresist layer in accordance with the gate contact mask of FIG. 8.

FIG. 10 is a cross-sectional view as in FIG. 9, illustrating the wafer following the removal of selected materials which are not protected by the portions of the photoresist layer of FIG. 9 defined by the mask of FIG. 8, producing troughs extending to and exposing the surface of the silicon wafer and delineating the gate, source and drain polysilicon-to-silicon contact regions.

FIG. 11 is a cross-sectional view as in FIG. 10, illustrating the wafer cross-sectional structure following the growth of a crossover oxide in the troughs of FIG. 10.

FIG. 12 is a plan view illustrating a metalization mask for defining the metalization pattern of the wafer.

FIG. 13 is a cross-sectional view along line 13—13 in FIG. 12, illustrating the wafer following delineation of the metalization in accordance with the masking produced by the mask of FIG. 12.

DESCRIPTION OF THE PREFERRED EMBODIMENT

Figure 13:
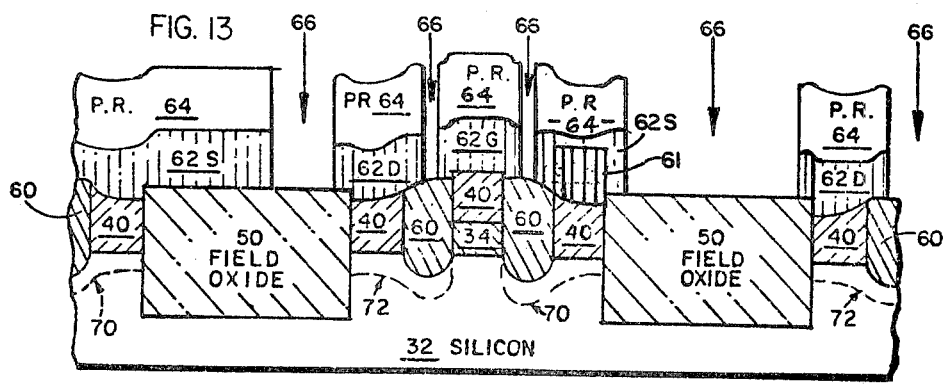
Figure 14:
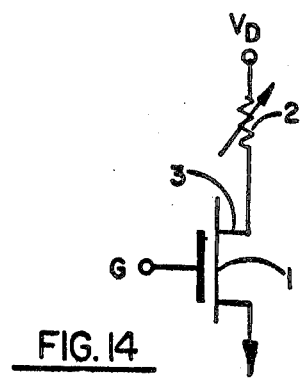
FIG. 14 is an electrical schematic portrayal of the redundant cell of the subject invention.
Figure 15:
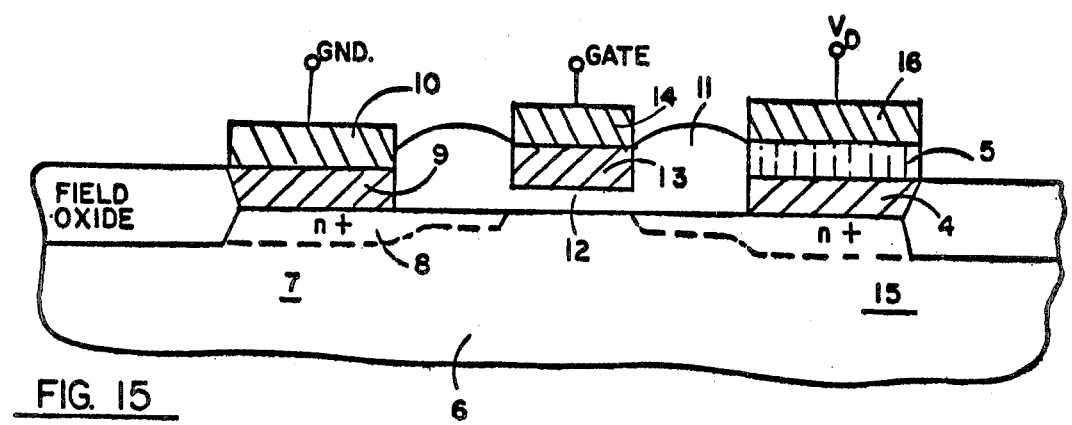
FIG. 15 is an enlarged cross section through a fabricated redundant cell.
Figure 16:
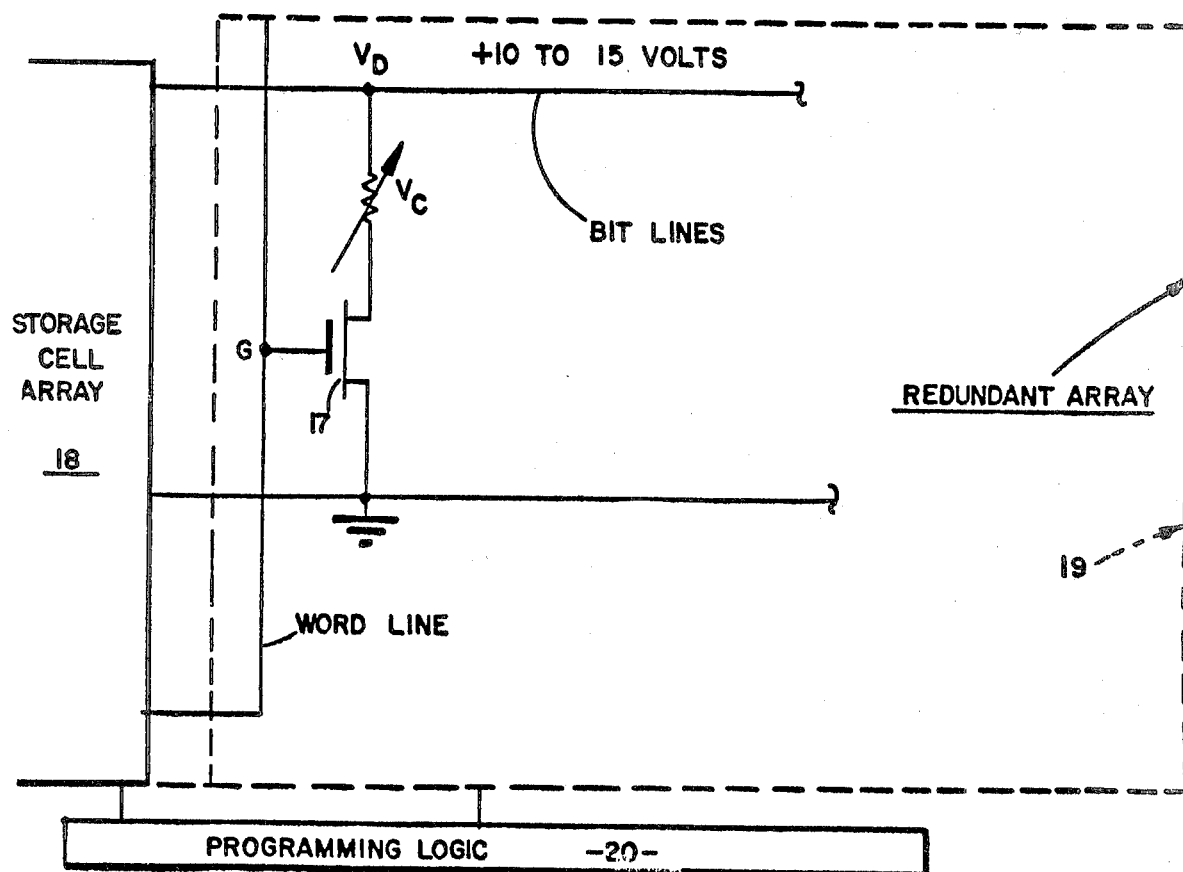
FIG. 16 is a schematic showing the manner of replacing a ROM cell by a redundant cell.

The final ROM redundant cell, developed by process steps of FIGS. 1–13 is depicted in FIGS. 14 and 15, and an application thereof in FIG. 16. A description of these figures initially may be helpful in understanding the more involved processing steps.

In FIG. 14, the VLSI fabricated transistor is shown as FET 1 and the coding resistor 2 is in electrical connection with its drain 3 by virtue of physical contact of drain doped polysilicon layer 4 and resistor undoped polysilicon layer 5 (FIG. 15). Processing of substrate 6 is otherwise carried out in accordance with the preferred process of U.S. Pat. No. 4,231,051, issued to the same inventors on Oct. 28, 1980. Source 7 comprises doped region 8 overlaid by doped polysilicon 9 and metal contact 10. Crossover oxide 11 surrounds gate region 12 comprising doped polysilicon layer 13 and contact 14. Also, drain region 15 includes contact 16 over undoped polysilicon 5. The critical voltage for changing the conductivity characteristics of resistor 5 is $V_c$ which is a function of the polysilicon thickness of layer 5, temperature of deposition and doping concentration, following conventional NMOS techniques the polysilicon thickness may typically range from 3,000 to 6,000 A, the temperature of deposition may, for example, be 450 degrees to 650 degrees K and the doping concentration is 0++. By properly selecting these terms, $V_c$ becomes +10 to 15 volts, (within the NMOS range of conventional voltages).

In operation, with the gate (FIG. 14) turned on by gating potential applied at G, a $V_D$ voltage of +10 to 15 volts will irreversibly change the normal high polysilicon resistance to a very low value for high conductivity. The high resistivity state may comprise a digital 0 logic storage and the high conductivity state may comprise a digital 1. Thus, electrical programming is available and its implementation does not require extra real estate because the undoped polysilicon layer 5 simply is formed over drain conductor 4. Also, redundant cells are not used until needed, so less cells are required as they may be field programmed to either logic state to replace a bad cell.

FIG. 16 illustrates a schematic for introducing redundant cells, such as 17, into memory array 18 to replace bad cells. Redundant array 19 includes many cells, such as 17, which may be electrically programmed as needed and annexed into the main ROM. Address Programming Logic 20 changes the bad cell address to that of a replacement programmed redundant cell in Array 19.

A preferred process for producing electrically programmable cells is set forth in FIGS. 1—13, as follows.

The technique which is the broad subject of this invention is widely applicable in the field of semiconductor fabrication. Many variations of the technique are possible in accordance with the individual objectives of various fabrication processes. However, the basic concept off the process is best illustrated by a specific example of the fabrication of a specific device. Consequently, the following detailed description will describe the fabrication of an N channel field effect transistor having a polysilicon resistor in series therewith to comprise a redundant cell in a ROM in integrated circuit. However, it will be readily understood that this process is equally applicable to the formation of P channel transistor cells.

Figure 1:
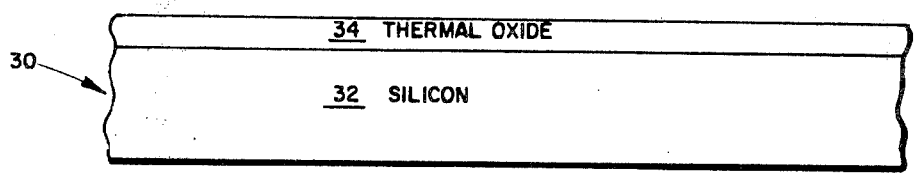
FIGS. 1, 3, 4, 6, 7, 9–11 and 13 are cross-sectional drawings illustrating successive stages in the processing of a semiconductor wafer in accordance with the invention.
Figure 2:
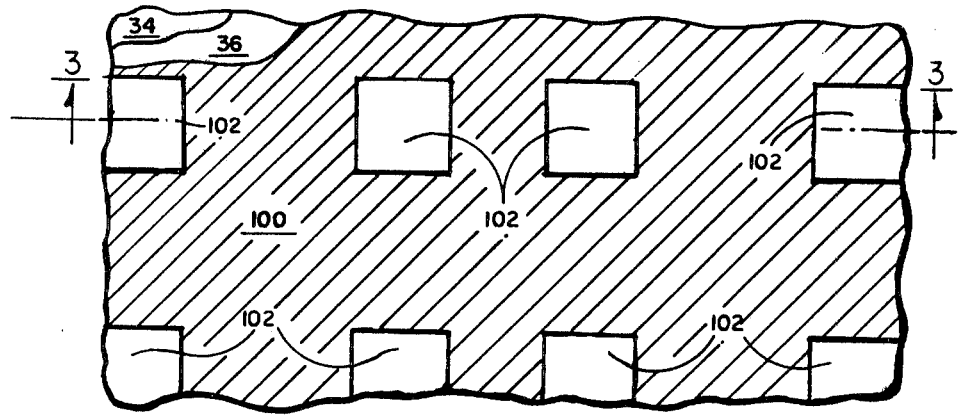
FIGS. 2, 5, 8 and 12 are plan views illustrating different masks utilized during the process of forming devices in accordance with the invention and the relative alignment of different masks with respect to the underlying wafer.

We now turn to the detailed description of the preferred embodiment of the invention and in particular to FIG. 1 which illustrates a wafer 30 of clean semiconductor material (e.g.-silicon) 32 on which a dielectric layer 34 has been formed. The semiconductor 32 may either constitute the entire body of the wafer prior to the formation of the dielectric layer 34 or may comprise a relatively thin layer disposed on an appropriate supporting substrate. The treatment utilized to form the dielectric layer 34 may in part depend on the semiconductor 32. However, in accordance with the specific process steps of this preferred embodiment, the dielectric layer 34 should be one which is suitable for use as a gate dielectric of a field effect transistor (FET).

Semiconductor 32 is preferably silicon and the treatment preferably comprises thermally oxidizing the surface to form a silicon dioxide layer as the dielectric layer 34, suitable for use as the gate dielectric of field effect transistors. For the purposes of this description, it will be assumed that semiconductor 32 is already doped p-type. The dielectric layer 34 is then patterned in accordance with a predetermined pattern. This may be done by an appropriate process, but is preferably done using photoresist and photolithography.

Figure 3:
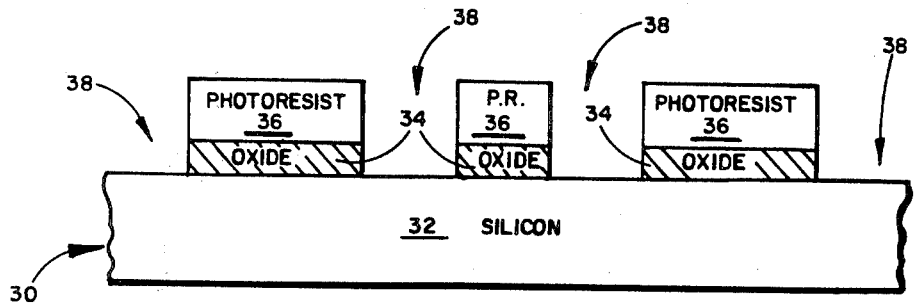

A layer 36 of appropriate photoresist is provided on the wafer 30 on top of layer 34 and exposed to actinic radiation through a contact mask 100 (plan view FIG. 2) which includes non-protective areas 102 which render the photoresist thereunder soluble while the remainder of the photoresist is rendered nonsoluble. After exposure of the photoresist to actinic radiation through mask 100, the photoresist is developed with the result that photoresist 36 remains on the wafer everywhere except within those areas 38 of the wafer which were in alignment with mask areas 102. Layer 34 is not protected by the photoresist in those areas 38. The unprotected portions of layer 34 are removed in an appropriate manner. Where layer 34 is silicon dioxide, wafer 30 may be etched in a silicon dioxide etchant such as hydrofluoric acid until all of the oxide 34 in the regions 38 has been removed to leave bare unprotected silicon in the unprotected regions 38 while portions of the gate dielectric layer 34 are retained under photoresist 36. At the end of this removal step, the wafer appears in cross-section as shown in FIG. 3. Thereafter, the remaining photoresist 36 is removed.

As will later become clear, the portions, or areas, 38 of the surface of the silicon semiconductor layer 32 which are exposed in this step are those which will include the source and the drain, for example, of the field effect transistor to be formed. Doping of the silicon 32 may now be performed through these exposed areas 38. The remaining portions of the oxide layer 34, such as seen in cross-section to the left and right of the central, gate dielectric portion of the oxide layer 34 in the view of FIG. 3, are retained for the purpose of preventing undesired doping of the silicon layer 32 in those regions; in this example, those regions will be employed for thermally growing a field oxide to isolate the field effect transistor from adjacent devices.

Figure 4:
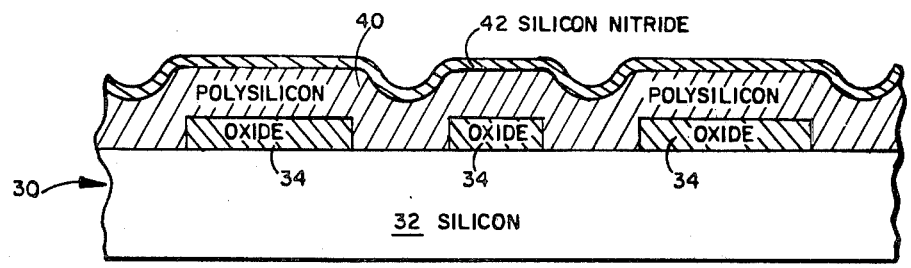

As shown in FIG. 4, a layer 40 of doped polyscrystalline silicon (polysilicon) is deposited over the entire surface of the wafer and the polysilicon layer 40 is then coated with a layer 42 of silicon nitride. Layer 40 may be undoped and then doped in situ by exposure to high temperature diffusion or ion implantation. The polysilicon 40 is doped to have the same conductivity type as the source and drain will have (n-type in this example). The polysilicon 40 is then patterned, preferably by use of photoresist. As will later be seen, the use of the silicon nitride layer 42 is of substantial significance, since it permits selective oxidation of the exposed surfaces of the silicon 32. For example, field oxide regions may be thermally grown on the exposed silicon surface without using a mask, since the surfaces protected by a silicon nitride layer 42 are not readily oxidized. Particularly, silicon nitride requires a much higher temperature for thermal oxidation than does silicon. In another context, the silicon nitride layer can be etched preferentially or selectively as respects correspondingly exposed surfaces of silicon dioxide without masking, e.g., by using a dip etch. This factor contributes as well to the capability of achieving self-aligned gate and other contacts.

In accordance with the present example, the next step is to produce a desired pattern in the silicon nitride protecting layer 42. A layer 44 of photoresist is provided on the silicon nitride layer 42 and exposed to actinic radiation through an isolation mask 110 (seen in FIG. 5). The isolation mask 110 includes substantially rectangular protective regions 114 which cause the photoresist thereunder to be rendered nonsoluble while the remainder of the photoresist is rendered soluble as a result of the exposure of the photoresist to actinic radiation. The configuration of the isolation mask and its desired alignment with the polycrystalline-silicon to monocrystalline-silicon contact regions 38 are illustrated in the plan view of FIG. 5.

Figure 5:
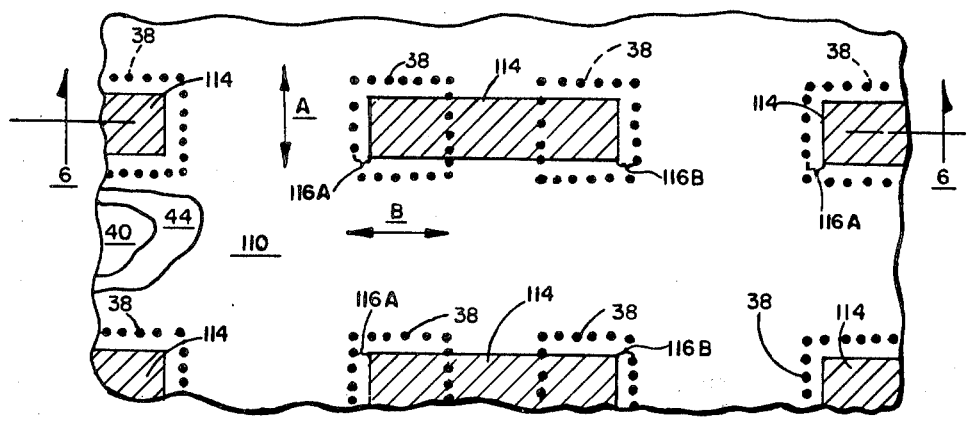

As is apparent from FIG. 5, the contact regions 38 as initially defined are of larger size than the final dimensions of the actual areas of contact to the substrate, as determined by subsequent processing steps; particularly, the protection regions 114 are of reduced length relatively to the distance between the outer boundaries of the contact regions 38 and of relatively reduced width. Subsequent processing, to be described, removes the polysilicon 40 and, optionally, may remove as well any of the oxide 34, which remains outside the perimeter of respective ones of the various protecting regions 114. Thus the area of contact between the polysilicon 40 and the silicon substrate 32, as afforded by protection regions 114 of mask 110, is reduced relatively to the substrate area 38 exposed through mask 100. Subsequent figures, however, retain these initial dimensions of the contact regions 38, and of the gate oxide 34, for purposes of illustrating the tolerance to mask misalignment afforded by the present invention.

Figure 6:
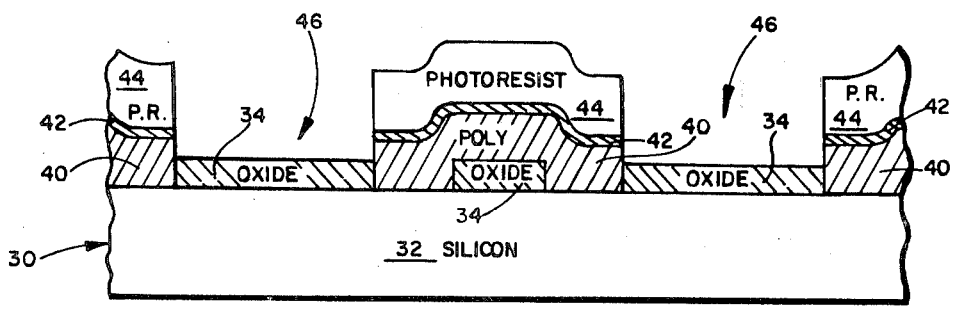
Figure 7:
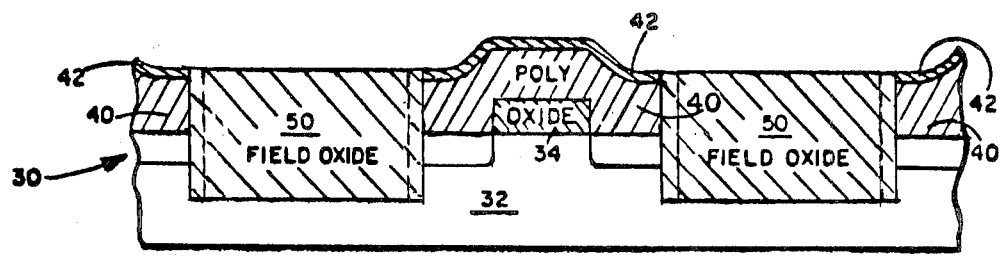

The alignment of the isolation mask in the "A" direction is adequate if the protecting regions 114 do not extend beyond the upper or lower edges of the poly-to-mono-silicon contact regions 38 in FIG. 5. The alignment of the isolation mask in the "B" direction also has a substantial tolerance as the result of the succeeding processing steps. The left-hand and right-hand vertical edges of areas 114 in FIG. 5 must lie within regions 38. Ideal alignment in the "B" direction will make the distances 116A and 116B between the respective end edges of regions 114 and the outer edging of the respectively associated regions 38 equal. The exposed photoresist layer 44 is developed to uncover the silicon nitride layer 42 in the areas 46 as shown in FIG. 6, where the photoresist was rendered soluble (i.e. areas not under regions 114); conversely, the photoresist portions 44 which were rendered nonsoluble by the photolithographic exposure of the mask, (i.e. areas under regions 114), remain on the wafer.

Following the development of the photoresist 44 in accordance with the isolation mask 110, the unprotected portions of the silicon nitride layer 42 are removed in an appropriate manner. Next, the polysilicon 42 which was uncovered and thus exposed by the removal of the unprotected portions of the silicon nitride layer 42 is removed in an appropriate manner. Next, the portions of the oxide layer 34 which are uncovered and thus exposed by the removal of portions of the polysilicon layer 40 may be retained, or removed in an appropriate manner, (e.g.-etched away) as desired. As shown in FIG. 6, the silicon dioxide 34 is retained in the areas 46, and the field oxide will be grown further therewith. Removal of the exposed silicon dioxide 34 is desirable when there has been damage to it or its surface rendered irregular during the removal of the overlying polysilicon layer. In those cases, where the silicon dioxide layer 34 is removed, the surface of the silicon 32 is directly exposed and a field oxide is then grown directly on that exposed silicon surface. If the process is being performed on a bulk silicon wafer, the silicon of the wafer may be removed to a depth of approximately 0.5 microns in the unprotected areas. If the process is being performed on a silicon on sapphire or similar composite wafer, the silicon may be removed to a depth such that subsequent field oxidation of the remaining silicon will convert that remaining silicon to a silicon dioxide layer which is substantially level with the upper surface of the remaining portions of the polysilicon layer 40, thereby consuming substantially all of the remaining silicon in regions 46.

In the case of a monocrystalline silicon 32 as the substrate, the unprotected surface has a field oxide grown thereon to prevent inversion of that silicon surface. As before noted, the pattern of polycrystalline-silicon-to-monocrystalline-silicon contact mask 100 was selected to prevent the polysilicon 40 from contacting the monocrystalline silicon 32 in the regions which will form the field oxide, in order to prevent unintentional or undesired doping of the monocrystalline silicon under the field oxide. At the completion of the above removal steps, subject to the above observations, the wafer appears in cross section as illustrated in FIG. 6.

If it is desired to dope the field regions to control their inversion thresholds, this may be done by ion implantation prior to the removal of photoresist 44 in order that photoresist 44 may act as a self-aligned implantation mask. Thus, if a field implant is performed, the remaining photoresist 44 is removed after the implant is performed; otherwise, photoresist 44 is removed after the completion of the above-discussed removal steps.

Next, the wafer is exposed to thermal oxidation conditions for a period of time sufficient to oxidize the exposed silicon 32 to form a thermal field oxide layer 50 having an upper surface at a level which minimizes discontinuities between its upper surface and the upper surface of the remaining polysilicon 40. During this thermal oxidation step, vertical oxidation of the retained polysilicon 40 is prevented by the overlying silicon nitride layer 42. After the thermal oxidation process has been terminated, the wafer appears in cross section as in FIG. 7.

Figure 8:
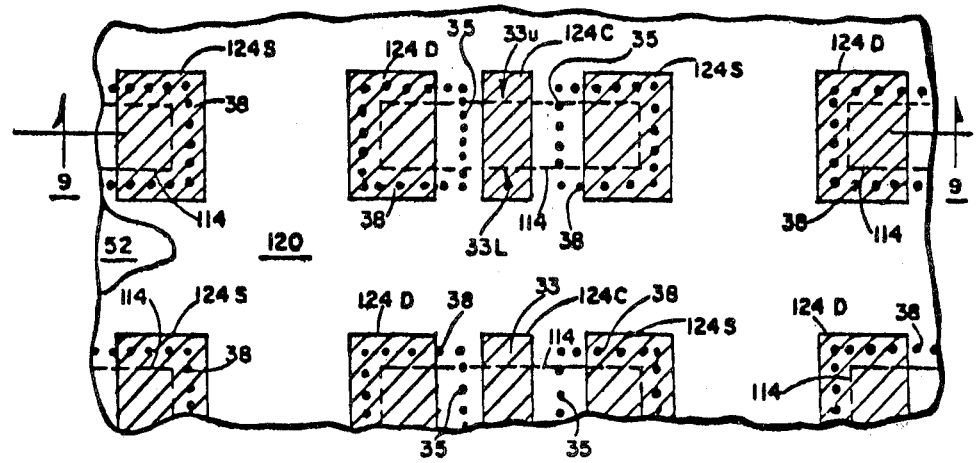

The wafer is then coated with a third photoresist layer 52 which is subsequently exposed to actinic radiation through a gate contact mask 120 (FIG. 8). Processing in accordance with the gate contact mask 120 renders the photoresist thereunder soluble over most of the area but renders the photoresist non-soluble under mask protective areas 124. Areas 124C each cover a central strip 52C of the photoresist over the multi-layered structure comprising the gate oxide 34 and the polysilicon 40 thereon. Areas 124D and 124S are spaced a predetermined distance from the gate mask area 124C and are of a size and configuration such that each covers a significant portion of the photoresist (52D and 52S, respectively) overlying respective ones of the individual polycrystalline-silicon-to-monocrystalline silicon contact areas 38 and extending outwardly therebeyond. This affords a misalignment buffer as regards mask 120 and specifically the areas 124D, C and S thereof relative to the boundaries 114. For proper ultimate device operation, the mask 120 must be aligned in direction "B" so that the (vertical in FIG. 8) edges 35 of the silicon dioxide layer 34, a portion of which will form the gate dielectric after subsequent processing, are both located where they are not protected by the photoresist 52 after it is developed. The mask 120 must be aligned in direction "A" so that the photoresist 52C spans the gate oxide 34 in the direction "A" so that there is a strip of gate oxide (i.e., dielectric) thereunder which is protected, from upper edge 33U in FIG. 8 to lower edge 33L in FIG. 8.

The mask protection areas 124C, relating to the gate, and 124D and 124S, relating respectively to the drain and source, are seen to be again over-size, i.e., larger in both width and length dimensions than those portions of the corresponding regions defined by the mask size 114. As will later be seen, the photoresist elements, or portions 52D, C and S, respectively resulting from the mask protection areas 124D, C and S ultimately will serve to define those portions of the silicon nitride layer 24 which are retained. Retained portions of the silicon nitride layer 42 ultimately will afford self-aligned contact areas to the gate, drain and source regions of the field effect transistor. As above noted, the precise alignment position in the directions A and B of the mask 120 is not critical but rather misalignment of mask 120 may occur, offsetting the actual positions of the particular areas 124C, D and S, from those ideal positions indicated in FIG. 8. The limits on such offset as may occur and be tolerated, are readily within the capabilities of mask alignment procedures in current technology.

Figure 9:
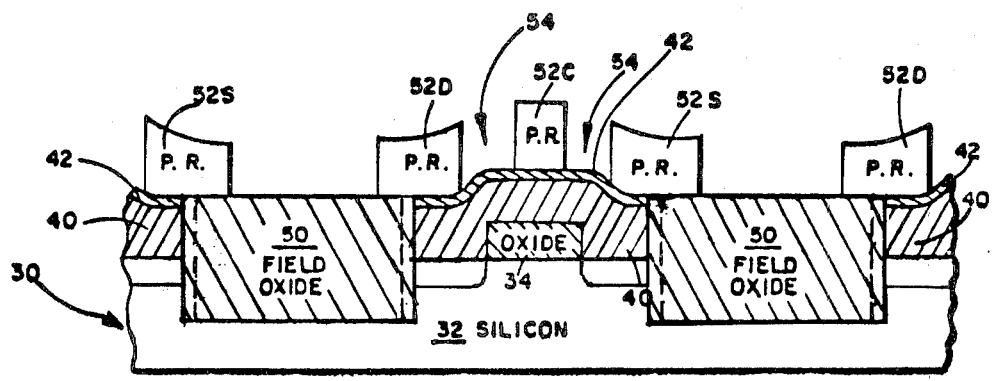
Figure 10:
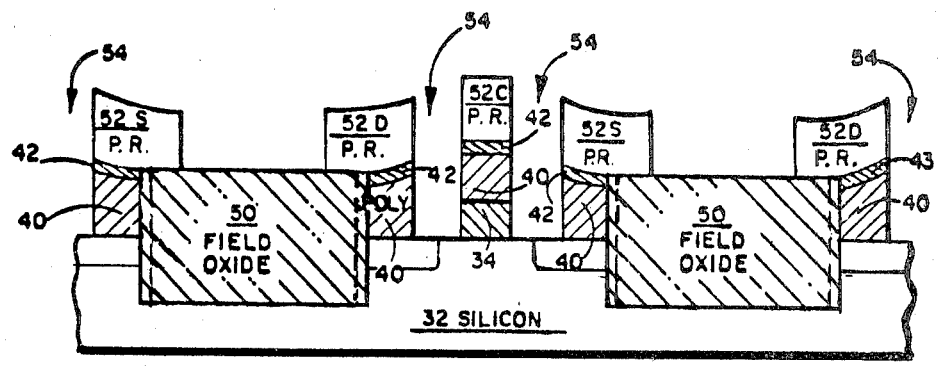

After exposure of the photoresist through the gate contact mask 120, photoresist 52 is developed to remove the soluble portions of the photoresist. FIG. 9 is a cross section through FIG. 8 taken along the line 9—9 after development of the photoresist. After development of the photoresist, there are troughs 54 between each photoresist island 52C and the adjacent photoresist islands 52D and 52S. The islands 52C, 52D and 52S are over channel regions, drain regions and source regions, respectively, of field effect transistors. Additional islands would be provided for additional types of devices. The unprotected portions of the silicon nitride 42 are removed in an appropriate manner. The polysilicon 40 which is uncovered by the removal of the silicon nitride is removed, preferably with a minimum of attack on the monocrystalline silicon thereunder. The removal of the polysilicon 40 uncovers any portions of the gate oxide 34 which extend laterally beyond the edges of the overlying photoresist 52C. The unprotected portions of the gate oxide 34 are removed in an appropriate manner and the wafer appears as in FIG. 10. The removal of those portions of the gate oxide layer 34 which extend outside the boundaries of the photoresist protection portion 52C will cause removal of material from the field oxides 50 as well. However, the gate oxide 34 is so much thinner than the field oxide that such removal of material from the surface of the field oxide 50 is minimal and not detrimental. Nevertheless, the photoresist drain and source portions 52D and 52S, respectively are located preferably so as to overlap onto the adjacent field oxides 50 as shown in FIG. 10, thereby reducing the possibility of undercutting of the field oxide 50 adjacent the drain and source polysilicon material 40.

After the step of removing the unprotected portions of gate oxide 34 has been completed, the entire bottom of each of the troughs 54 is bare unprotected silicon 32, except at the ends of the troughs where they are over field oxide. The unprotected portions of the silicon 32, which are adjacent the gate or channel regions, are then doped n-type to form source and drain regions. This doping may be done by ion implantation, by solid-state diffusion from doped oxides or by any other appropriate method. The remaining photoresist 52 is removed from the wafer. This step of removing the remaining photoresist 52 may precede or follow the doping step, depending on the doping method utilized.

Next, the wafer is thermally oxidized to grow a thermal crossover oxide 60 on the unprotected portions of the source and drain regions (i.e. bare silicon 32). The silicon nitride protection layer 42 prevents thermal oxidation in those associated protected areas. Hence, selective thermal oxidation is performed while the portions of the silicon nitride layer 42 remain in place defining the contact areas to the source, drain and gate regions, preventing the development of any thermal oxide thereover. Ultimately, these remaining portions of the silicon nitride layer 42 are selectively removed such as by a dip etch which has no effect on the exposed oxide surfaces, thereby to expose those corresponding contact areas and thus afford self-aligned contacts to the source, drain and gate regions.

Figure 11:
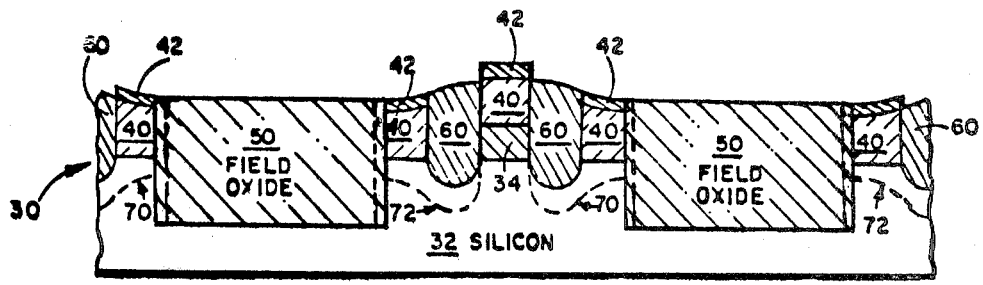

During the thermal oxidation for developing the cross-over oxide 60, the dopant introduced in the source and drain doping step will diffuse deeper into the monocrystalline silicon 32 and laterally within the monocrystalline silicon 32 and thus slightly under the gate oxide 34 under the polysilicon 40 of the gate. In fact, once the polysilicon layer 40 is deposited, on each subsequent occasion of heating the wafer to a temperature which is sufficient to induce dopant diffusion within the monocrystalline silicon 32, some of the dopant in the polysilicon 40 diffuses into the portions of the monocrystalline silicon 32 in contact therewith. During the oxidation step for developing the crossover oxide 60, therefore, impurities introduced into the silicon 32 from the doped polysilicon 40 diffuse further within the monocrystalline silicon 32 and create continuous source and drain regions 70 and 72 (shown in FIG. 11) at the corresponding polycrystalline-to-monocrystalline-silicon contact regions 38. Each of these regions 70 and 72 extends from under the polysilicon gate (34) out to the corresponding field oxide portions 50. However, if process temperatures are kept low, lateral diffusion can be reduced to a negligible amount, if so desired or preferred. Once the crossover oxide 60 has grown to a desired thickness, the thermal oxidation is stopped. The desired thickness may be one which minimizes surface discontinuities between the polysilicon 40 over the source and drain regions and the polysilicon gate, or one which minimizes crossover capacitance, or some other thickness. At the end of the thermal oxidation step, the wafer appears in cross-section as shown in FIG. 11.

There thus are provided at the surface, either an oxide (and particularly silicon dioxide), such as from the field oxide regions 50 or the crossover oxide 60, and selected small portions of the silicon nitride layer 42 covering contact areas to the source, drain and gate regions. This remaining portion of the silicon nitride layer 42 for the drain region is removed by selective etch to expose the underlying surface of the polysilicon layer 40 in the drain region.

Figure 11A:
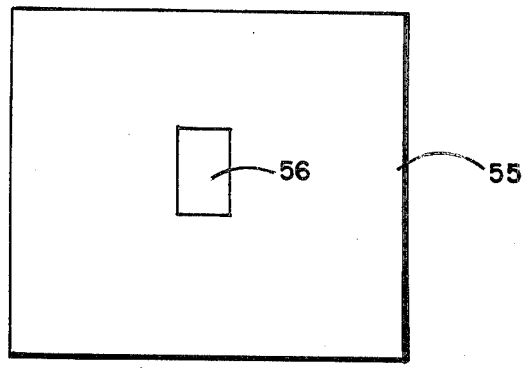
FIG. 11a shows a mask for use in forming the resistor in series with the drain.
Figure 11B:
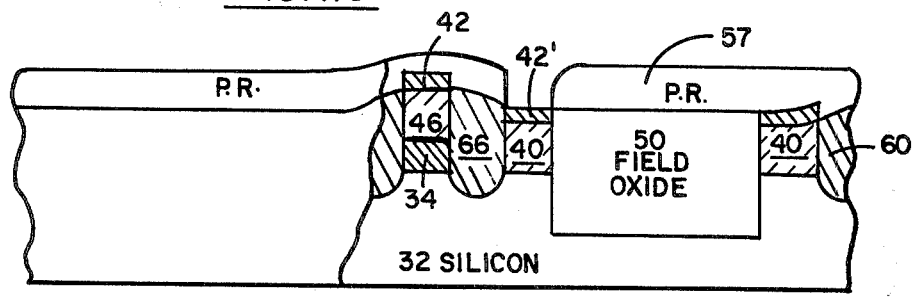
FIG. 11b shows the photoresist layer opened by the mask of FIG. 11a above the silicon nitride button to permit removal thereof by dry etching.

Next the resistor in series with the drain will be formed. Referring now to FIG. 11a, mask 55 is shown having an opening 56 therethrough in alignment with the drain region covered by the silicon nitride button 42 to the right of the crossover oxide 60 and to the left of the right-hand field oxide 50. Photoresist layer 57 is deposited and mask 55 opens the region directly above this silicon nitride button 42', permitting its removal by dry etching without affecting remaining structure, as is shown in FIGS. 11b and 11c.

Figure 11C:
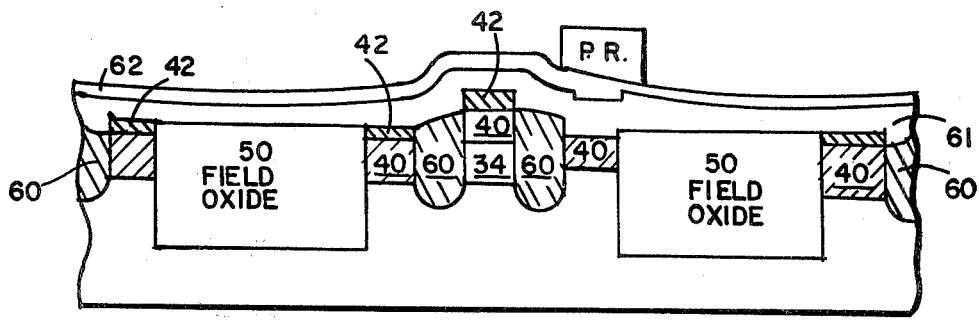
FIG. 11c shows the wafer after removal of the remaining photoresist and application of an undoped polysilicon layer, followed by a layer of silicon nitride.
Figure 11D:
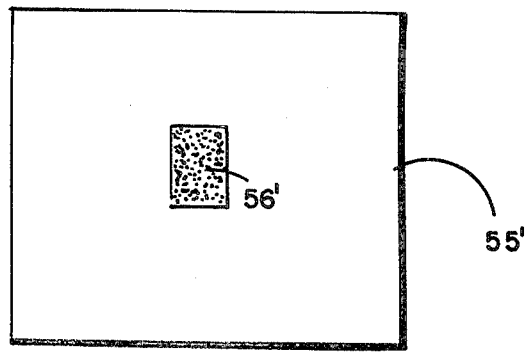
FIG. 11d shows an opposite mask to that of FIG. 11a, which protects a portion of the silicon nitride to permit removal of the remainder of the layer through conventional processing.

Once the nitride button is removed, and the photoresist stripped off, an undoped polysilicon layer 61 is deposited over the entire wafer making direct contact with the doped polysilicon 40 over the drain region as best seen in FIG. 11c.

Next a layer of silicon nitride 62 is laid down over the entire wafer and the opposite mask 55' (FIG. 11b) to that of FIG. 11a is employed to cover or protect the silicon nitride 62 on top of the undoped polysilicon 61 and permit removal of the remainder of this layer through the above-mentioned photoresist techniques and dry etching.

Figure 11E:
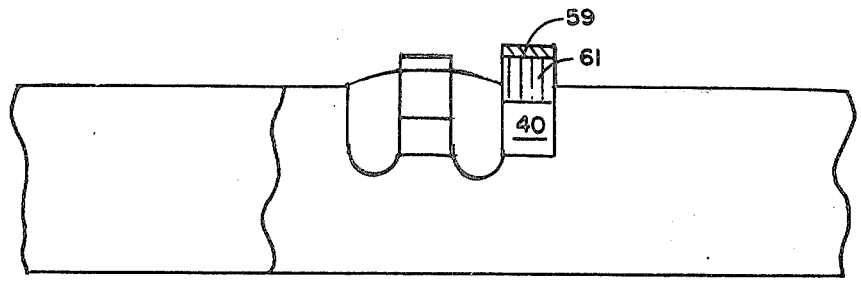
FIG. 11e shows the resistor as comprising an undoped polysilicon layer in contact with a doped polysilicon layer in electrical connection with the drain.

Thus, in FIG. 11e, the resistor comprises the undoped polysilicon layer 61 in contact with the doped polysilicon 40 comprising the drain conductor in electrical connection with the doped region 70. Hence, the wafer 32 now includes the three basic regions, i.e. the source, gate and drain with series resistor protected by silicon nitride buttons 42, 42 and 59, respectively.

Figure 12:
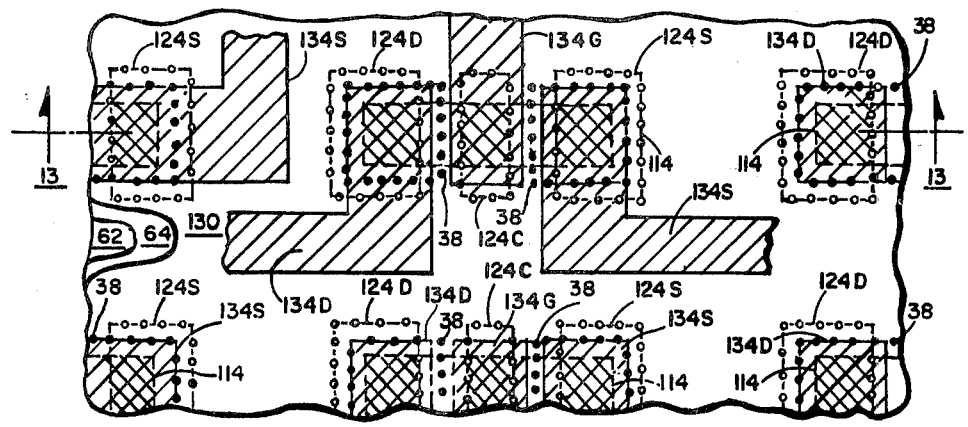

A conductive material 62 such as metal or polysilicon is then deposited on the wafer. A photoresist layer 64 is provided on conductive material 62 and exposed to actinic radiation through a metallization mask 130 which delineates the geometry of the conductive material. Wherever it is desired to retain contact material 62, mask 130 has protective areas 134 which render the photoresist 64 thereunder nonsoluble. A portion of mask 130 is illustrated in FIG. 12. Areas 134D, 134G and 134S define the portions of conductive material 62 which will be connected to the drain via its series resistor 61 the gate and the source, respectively, of individual field effect transistors. The areas 134D, 134G and 134S over the respective drain, (resistor) gate and source regions respectively are of substantially greater lateral and length dimensions than the corresponding contact regions themselves. This is made possible by the isolation, or electrical insulation, afforded by the field oxides 50 and the crossovers 60, which permit these contacting areas to overlap from the contact regions themselves onto the adjacent oxide surfaces without any deleterious effect and particularly without any concern of shorting. Since these contacting metallized areas are defined by a single masking step, alignment between those contacts associated with a source and a drain (resistor) versus that associated with a gate is assured, and so long as a given contact area makes substantial contact with associated contact region, adequate electrical connection to all areas will be accomplished. In general, the only limitation is that the mask cannot be so far out of line such that one contact area overlaps from its intended contact region, extending not only across an intervening insulator (e.g. the cross-overs 60) but also into overlap positions on an adjacent contact region. Conventional manufacturing techniques are adequate for avoiding such an extreme case of mask misalignment which could render this result.

Ideal alignment between the areas 134 of mask 130 and the already existing structure is illustrated by the position of the underlying areas 38, and the positions previously occupied by protective areas 114 and 124 of masks 110 and 120, respectively. It will be understood that the actual areas present in the underlying structure do not correspond to the outlines 38, 114 and 124, but were determined by them at least initially. In particular, the areas 38 have been changed by the subsequent applications of (1) the isolation mask 110 which delineated changes in the location of three of the four boundaries of each region 38 and (2), and the mask 120 which delineated changes in the location of the remaining original boundary of the areas 38. In fact, for this ideal alignment illustration of FIG. 12, the drain, gate, and source contact regions, as they relate to the corresponding metallization areas, are encompassed in an evenly spaced, symmetrical manner by the metallization in those areas shown by the doubly cross hatched regions. It will thus be apparent from FIG. 12 that substantial misalignment of the mask may occur, yet, nevertheless, adequate electrical contact of the metallization areas on the exposed contact regions will be achieved, without concern of shorting.

Further, so long as mask 120 was properly aligned within mask alignment tolerances, the alignment of mask 130 in the direction "A" has substantial latitude, so long as a line from the center of the drain of each device to the center of the source of the same device is parallel to the direction "B".

Mask 130 must be aligned in direction "B" so that the gap between areas 134D and 134G of each device lies significantly on the crossover oxide 60. It is also necessary that the gap between areas 134G and 134S lies significantly on the crossover oxide 60. Proper alignment of the gap between 134D and 134G assures proper alignment of the gap between 134G and 134S. In this case what is mean by "lies significantly on the crossover oxide" is that a sufficient portion of that gap in on the oxide to assure that those conductive regions defined by areas 134D, 134G and 134S contact the area they are intended to contact and do not contact or short to the adjacent areas they are not intended to contact.

Once photoresist 64 has been exposed to actinic radiation through mask 130, the photoresist is developed. The removal of the soluble resist by the development process creates troughs 66 (as shown in FIG. 13) between the retained portions of the photoresist 64. The portions of conductive layer 62 which lie in the troughs 66 are not protected by the remaining photoresist 64. These unprotected portions of layer 62 are removed in an appropriate manner, thereby creating individual conductive lines. At this stage, the wafer appears as in FIG. 13. The remaining portions of photoresist layer 64 are preferably removed after the unprotected portions of layer 62 are removed.

It may be mentioned that self-aligned contacts are not essential to this invention, but such luxury does save real estate when the metal conductors are idealized. However, the principles of this invention are set forth in the claims as a measure of the intended scope of the invention.

What is claimed is:

1. A VLSI ROM with provision for redundancy comprising, in combination:
   a plurality of ROM cells each comprising a transistor;
   a plurality of surplus cells each having a transistor in series with a high resistance polysilicon resistor; and,
   means for selecting a surplus cell to replace one of said ROM cells, said surplus cell being irreversibly programmable to conductive logic state by the application of programming bias voltage across its transistor and associated resistor to establish a highly conductive condition for the resistor, and being representative of the non conductive logic state with the resistor intact at high resistance due to the absence of any application of programming bias voltage.

2. A cell for a high density ROM, comprising in combination:
- a substrate;
- a source doped region in said substrate having a doped polysilicon layer in contact with the region and a metal contact in electrical connection with the doped polysilicon;
- a gate comprising a doped polysilicon layer and a metal contact therein; and,
- a drain region comprising a doped polysilicon layer adjacent a drain doped region of the substrate;
  - an undoped polysilicon layer comprising a resistor over the drain doped polysilicon layer;
  - a metal contact over the undoped polysilicon layer; and,
- means for applying a programming voltage across the cell while it is in condition for conduction to irreversibly characterize the resistor as highly conductive.

3. A cell for a high density ROM, comprising in combination:
- a substrate;
- a gate with contact;
- a source with contact;
- a drain region comprising a doped polysilicon layer adjacent a drain doped region of the substrate;
- an undoped polysilicon layer comprising a resistor over the drain doped polysilicon layer;
  - a contact over the undoped polysilicon layer for the drain and resistor; and
  - means for applying a bias voltage between said contact over the undoped polysilicon layer and the source contact while applying a pulse to said gate for irreversibly changing the resistance of said resistor from very high to very low thereby affording a change from one logic state to another for said cell.

4. The cell of claim 3, wherein:
said source and gate each comprise a segment of doped polysilicon selected from said polysilicon layer.

5. The cell of claim 4, wherein:
cross over oxide separates the gate polysilicon segment from the substrate and from the source and drain doped polysilicon.

* * * * *